United States Patent
Avniel et al.

(10) Patent No.: US 6,541,392 B2
(45) Date of Patent: Apr. 1, 2003

(54) METHOD FOR FABRICATING THREE DIMENSIONAL ANISOTROPIC THIN FILMS

(75) Inventors: Yuval C Avniel, Longmont, CO (US); Alexander N. Govyadinov, Corvallis, OR (US); Peter Mardilovich, Corvallis, OR (US)

(73) Assignee: Technology Ventures, L.L.C., Scottsdale, AZ (US)

( * ) Notice: Subject to any disclaimer, the term of this patent is extended or adjusted under 35 U.S.C. 154(b) by 0 days.

(21) Appl. No.: 09/907,117

(22) Filed: Jul. 17, 2001

(65) Prior Publication Data
US 2002/0034882 A1 Mar. 21, 2002

Related U.S. Application Data
(60) Provisional application No. 60/232,950, filed on Sep. 15, 2000.

(51) Int. Cl.$^7$ .................. H01L 21/469; C23C 14/32
(52) U.S. Cl. ................... 438/762; 438/768; 204/192.12
(58) Field of Search ................. 438/758, 762, 438/768; 204/192.15, 192.12, 192.13

(56) References Cited

U.S. PATENT DOCUMENTS

| | | | | |
|---|---|---|---|---|
| 4,226,082 A | * | 10/1980 | Nishida | 368/285 |
| 4,544,468 A | * | 10/1985 | Munz et al. | 204/192 |
| 4,591,418 A | * | 5/1986 | Sndyer | 204/192 |
| 4,619,865 A | | 10/1986 | Keem et al. | |
| 4,882,022 A | | 11/1989 | Hoffman et al. | |
| 5,510,012 A | | 4/1996 | Schulz et al. | |
| 5,888,885 A | | 3/1999 | Xie | |

* cited by examiner

Primary Examiner—Amir Zarabian
Assistant Examiner—Pamela Perkins
(74) Attorney, Agent, or Firm—Martin Parkinson

(57) ABSTRACT

A method for the production of anisotropic, three dimensional thin films is disclosed. Instead of fabricating away from the routine tendency of vacuum sputter deposited thin films to form discontinuous islands which then accrete into the third dimension, the present method encourages this anisotropic formation. By precisely controlling gun voltage and deposition time, together with spectral control over the plasma forming gas and any reactive gas, with accurate substrate temperature control, and real-time feed-back and control over deposition parameters, two or more materials are sequentially grown on a substrate as distinct discontinuous islands. The resultant film maintains the optimum characteristics of each one of the film's components. Other novel structures made possible by the method of the invention include unique single component and post method deposited component anisotropic thin films.

19 Claims, 6 Drawing Sheets

METHOD FOR FABRICATING THREE DIMENSIONAL ANISOTROPIC THIN FILMS

This application claims the benefit of U.S. Provisional Application No. 60/232,950 filed Sep. 15, 2000. This invention relates to deposition methods such as chemical vapor and physical vapor depositions for the production of nano-structured thin films, and in particular to the production of three-dimensional anisotropic thin films.

BACKGROUND

Chemical vapor deposition (CVD) and physical vapor deposition (PVD) techniques are today routine technologies for the deposition of thin single and multi-layer films. These thin films are commonly used for optical, electrical, ornamental, wear resistant, and decorative applications. The films allow very small amounts of material to be deposited onto a substrate. These films allow not only a minimum of otherwise expensive materials to be used, but also enable miniaturization, enhancement of optical properties, precise electrical performance, user defined structures/morphology, and a profusion of surface specific compositions and surface treatments. However, when these conventional deposition techniques are used to deposit multiple components into a single film, the resulting film usually exhibits the lesser properties of the two components. For example, multi-layer structures which include one hard layer such as TiN (titanium nitride), and one soft layer such as gold (Au), do not exhibit the strength of TiN. Rather they are limited by the mechanical adhesive strength of the gold layer. At the same time the desired optical or electrical properties of gold are diminished due to the TiN phase. It is primarily to these difficulties in thin film fabrication methods that the present invention is directed. Other novel structures made possible by the method of the invention, including unique single component anisotropic thin films and post method deposited component films, will be further described below.

It is therefore a primary object of the present invention to provide a method for fabricating three dimensional, anisotropic nanostructured thin films.

A further object of the invention is to provide a method for fabricating nanostructured wear resistant thin film coatings with anisotropic properties.

An additional object of the invention is to provide a method for fabricating sculptured nanostructures.

Still another object of the invention is to provide a method for fabricating gold nanostructured thin film coatings with anisotropic electrical conductivity properties.

Yet another object of the invention is to provide a method for fabricating nanostructured composite conductive films.

SUMMARY

These and other objects are obtained with the present invention of a method for fabricating three-dimensional anisotropic thin films.

The term "Nanostructure" as used herein refers to structures with dimensions in a range between 1 to less than 100 nanometers (nm), as presently defined in the industry, and only defining the thickness range of the anisotropic lattice depositions produced by the method of the invention without restricting the ability for additional stratification or film growth.

Thin films of this type are commonly deposited onto a substrate, either in single or multiple layers, by means of chemical vapor deposition and physical vapor deposition techniques. A typical physical vapor deposition involves placing an object to be coated or upon which a film is to be deposited (substrate) within a vacuum chamber which also contains one or more target materials. A vacuum pump then produces a vacuum within the chamber. A small quantity of a gas, as, for example, argon, is admitted to the chamber. A power source such as a DC magnetron, or an RF diode power source, or an RF magnetron is then turned on, which causes the Ar (argon) to ionize and ion bombard the target material, which causes sputtering of the target material with subsequent sputtering deposition of the target material onto the substrate. The described method is also applicable to reactive depositions. These PVD techniques have found wide applications in micro electronics, decorative coatings, machine tool coatings, and other uses far too numerous to enumerate.

Prior utilization of this thin film technology has yielded either multi-layered, non-structured, or quantum dot depositions which will be more fully explained. In each case, these non-structured films at best provide some degradation of desirable original qualities for a two or more component film. Very thin films buckle due to the stress of having lattice structures slightly different in size from those of the materials upon which the films are grown. Just a few percent difference in lattice size creates stresses or pressures in a film that can reach up to $10^5$ torr. These huge pressures, when a new layer is deposited on the top of the first one, force the initially flat film to separate into dots and then top up into the third dimension to relieve stress. It occurred that rather than designing around this problem as was the case in the past, it might be possible to control this phenomenon, and have consecutive depositions yield three dimensional, anisotropic thin films which maintain the original desired properties of each of the deposited materials.

In the present invention the above described deposition techniques are employed to fabricate a three dimensional, anisotropic thin film. What is meant by this is that a substrate, which can be viewed for the sake of simplicity as a planar substrate in a horizontal position, has two or more different materials deposited on its surface. Alternate sequential depositions of the target materials cause each one to be deposited initially as discrete, separate, individual dots. Each additional sequential deposition of the same material then builds up on top of each initial dot of the material, so that the resultant film is composed of two or more multi-columns of each material, the columns being substantially vertical and normal to the planar substrate.

To this end a standard physical vapor deposition apparatus was modified so as to have precise control over the parameters of PVD deposition by providing accurate control of the partial pressure of plasma forming and reactive gases; spectral control of the plasma, in particular gas characteristics and wave length; accurate control of input gas flows, including real time feed-back between the control system and feed gages; real time feed back on deposition parameters; accurate control of gun energy and time; and accurate control of substrate temperature.

A method has been devised making use of the above control parameters that, when combined with the tendency of sputtered material to initially nucleate in small dots forming discontinuous islands with a specific area coverage ratio, which in turn creates a controllable three dimensional structure. At least two targets (e.g. gold and titanium), whose vacuum sputtering forms a characteristic nano-scale dot formation are used to form a discontinuous island film formation. This island film formation represents a certain ratio of area coverage versus open and less-conductive spaces between those islands. It is the control of this normal tendency of island formation (nucleation), based on specific and well known material characteristics, that this process is based. This natural structure characteristic is inherent in all sputtered material, which represents, in general, their lowest energy level and their negative affinity to each other. A plasma forming gas (e.g. argon) is introduced into the vacuum chamber, and a reactive gas (e.g nitrogen) may also be introduced into the vacuum chamber to react with at least one of the target materials. Gas metering is accurately controlled with a gas flow control system (e.g. spectrophotometer, mass flow meter, optical flow control, and other suitable gas flow control systems). In addition, gas flow and gas composition within the chamber is further refined with a real-time feed-back system so as to have accurate control over the partial pressure of the plasma forming and reactive gases. Accurately controlled and timed gun voltage (the power supply to the targets), together with substrate temperature control, with real-time feed-back on deposition parameters, and with the two or more target materials being sputter deposited in consecutive order, permits the formation of a three dimensional anisotropic structure. This unique, new structure preserves the original qualities of each one of the target materials. This structure is in a basic relevant contrast with the classical multi-layered deposition systems that only display the dominant material characteristics.

In general the success (S) of the deposition of the structured film can be expressed by the following empirical equation:

$$S=F(N, V_{1dep}, V_{2dep}, t_{dep}, A)$$

Where N is the concentration of forming nuclei, $V_{1dep}$ is the rate of deposition of the fist material, $V_{2dep}$ is the rate of deposition of the second material, $t_{dep}$ is the time of deposition, and A is the affinity of these materials to each other. Optimal conditions for the deposition of the structured films are in the range:

$$X_1 < S < X_2$$

In the case of $X_1$ we will have a chaotic mixture (or alloy) non-structured film. In the case of $X_2$ we will obtain a multi-layer deposition. With the controlled conditions of deposition described herein, which includes the probability of nucleation, rates of deposition, time of deposition and affinity of the two major components, a three dimensional anisotropic structure is obtained. While examples including gold, and titanium are given, it is to be understood that the method is applicable to any material capable of being sputtered deposited within the parameters of the method of the present invention. Other materials include, but are not limited to Pd, Al, Cu, and C (diamond). The "matrix" of the invention can be created, as one available approach, by reactive deposition of metals, which can be a variety of compounds, such as but not limited to: nitrides (ZrN, CrN, TiAlN);carbo-nitrides (TiCN); carbides (BC, SiC, WC); and oxides ($Al_2O_3$, Zr $O_2$) as well as by non-reactive deposition of other hard metals such as NiCr

DETAILED DESCRIPTION

Figure 2:
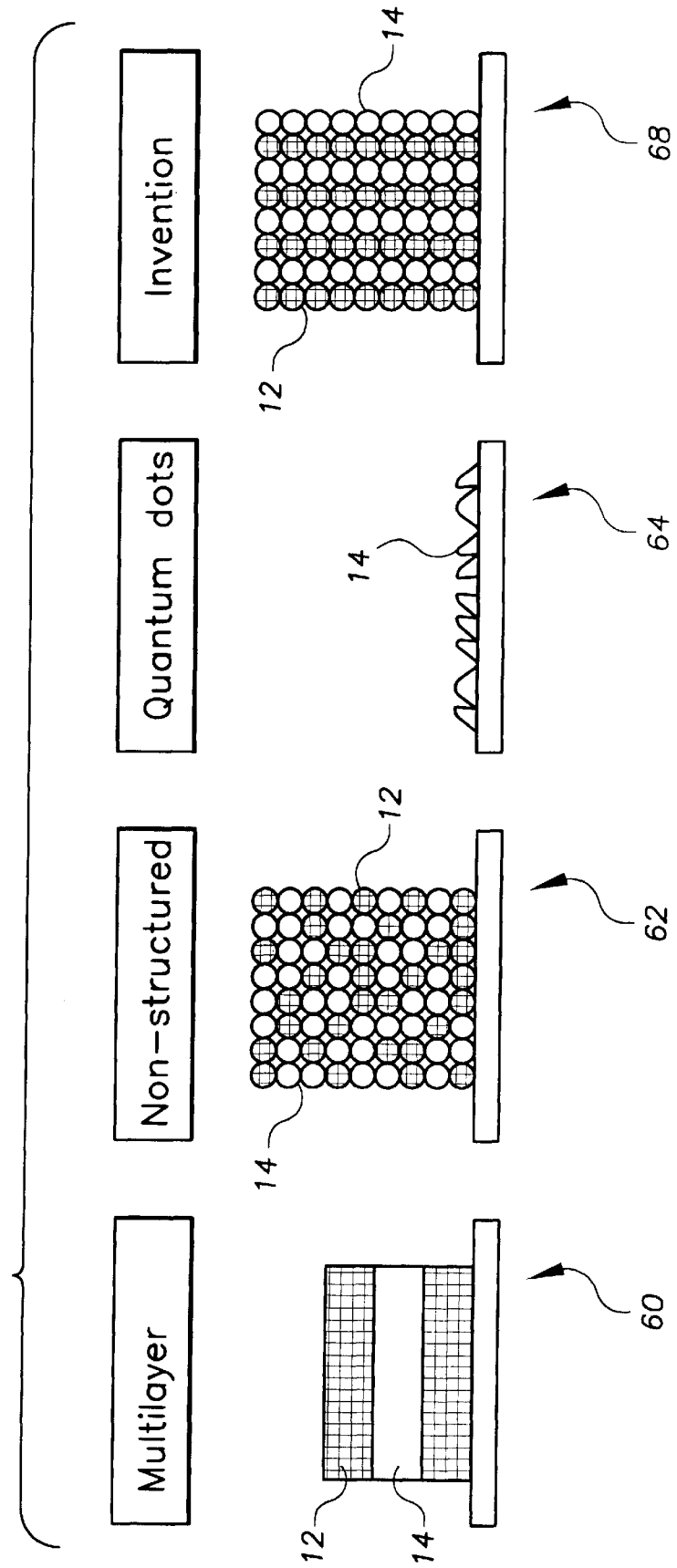
FIG. 2 is a schematic representation of prior art film depositions as compared with the depositions of the present invention.

We refer now to the drawings wherein similar structures having the same function are denoted with the same numerals. In FIG. 2 a schematic representation of a comparison between the vacuum sputter depositions of the prior art and the present invention is shown. Typical prior art depositions result in either a multilayer formation (60), a non-structured chaotic layer (62), or a quantum dot formation (64). In the present invention a structured alignment (68) of the individual target components (12, 14) is obtained as will be more fully explained.

Figure 3:
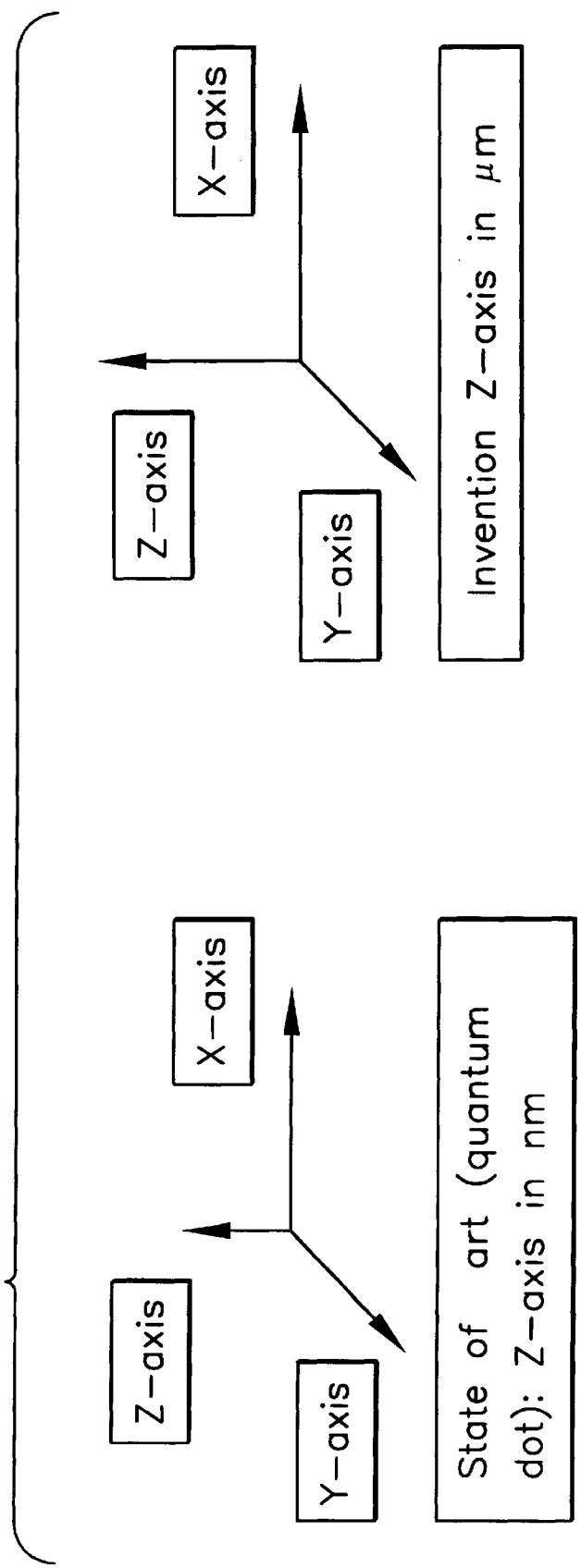
FIG. 3 is a schematic representation of the stresses of prior art differential lattice parameters as compared with the stress relief method of expanding into the third dimension of the present invention.

As noted above, very thin films, like those found in conventional deposition technologies, are prone to deformation and reduced performance due to the stresses of differential lattice parameters between the substrate and the deposition. These lattice differentials are also present between multiple systems when deposited on a substrate. These huge stresses are a function of the mobility of adatoms within the deposition matrix. It occurred that these huge pressures can be controlled and used advantageously to build preferentially oriented depositions on a nanometer scale. When new layers are deposited on the top of the deposition, the initially flat film can be separated into isolated dots which relieve stress by expanding into the third (Z-axis) dimension as schematically shown in FIG. 3.

The method of the present invention details the accurate control of the deposition parameters enabling and defining this stress expulsion. Under proper conditions consecutive depositions of two or more materials (12, 14—FIG. 2) can produce three dimensional structures defined by the user on a nano to micro scale. The structure formed is a function of the conditions of the deposition parameters of each individual component. The deposition is a function of the following parameters, which are controlled in order to build the correctly oriented deposition:

Accurate control of the partial pressure of plasma forming and reactive gases.
  Spectral control of the plasma, in particular gas characteristics and wave length.
  Accurate control of input gas flows, including real-time feed-back between the control system and feed gages.
  Real-time feed-back on deposition parameters.

Accurate control over gun energy and time.

Accurate control of substrate temperature.

As noted above present prior art deposition methodology generates either multilayer structures (60—FIG. 2), or non-structured composites (62—FIG. 2). A rate of deposition higher than the rate of ordering of the deposited layer will produce too thin a layer similar to example 62 (FIG. 2). Again, if the deposition results in a too thick layer a structure similar to example 64 (FIG. 2) will result. A "burgeoning" application is one whereby quantum dots (64—FIG. 2) is produced. Quantum dots are in the nanometer size range and are not capable of growing extensively into the Z-direction shown in FIG. 3. The present invention provides a method whereby a user can deposit highly structured depositions that are not restricted along either the X, Y, or Z-axis depicted in FIG. 3.

Figure 1:
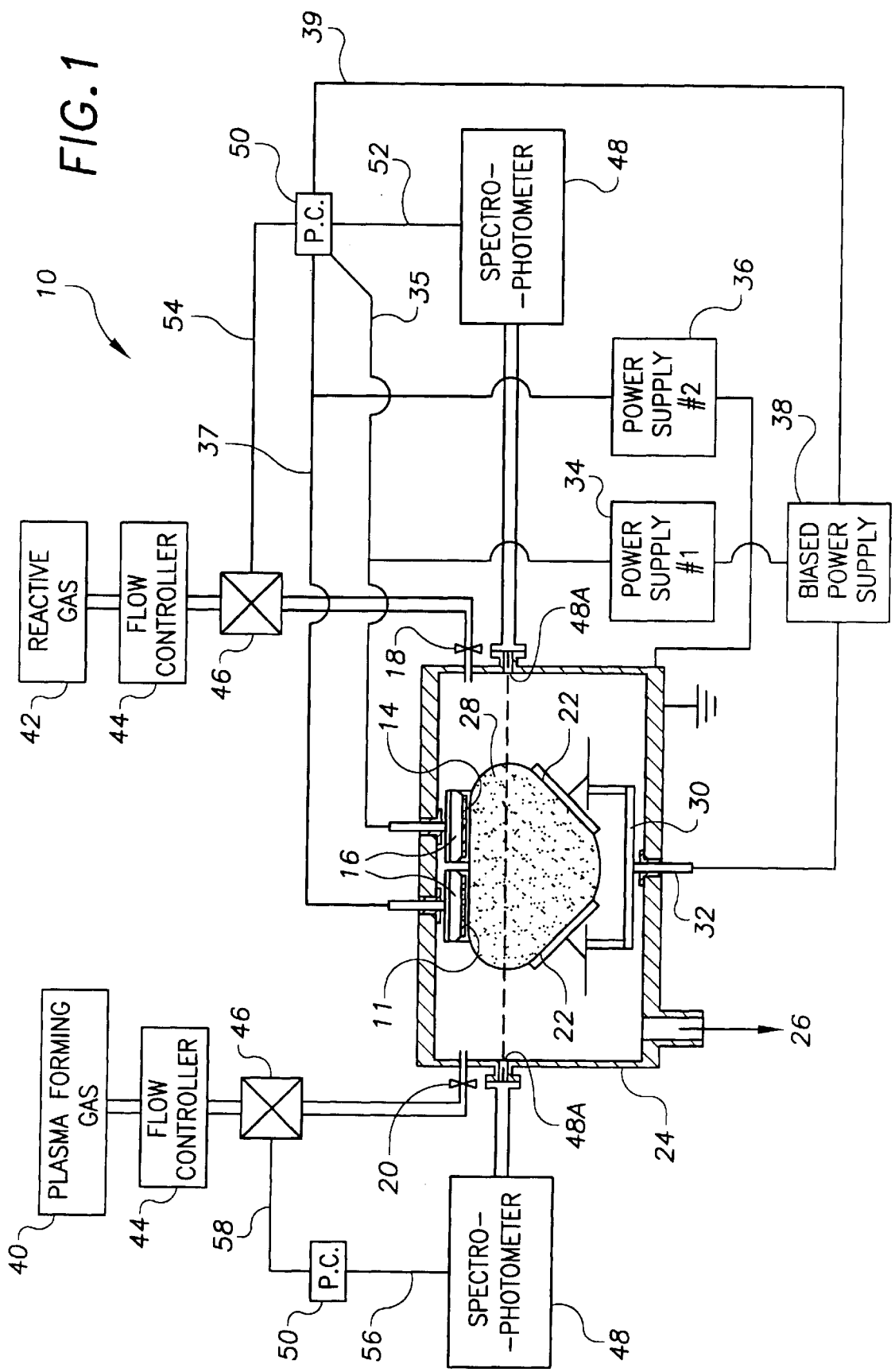
FIG. 1 is a schematic view of a physical vapor deposition apparatus.

Turning now to FIG. 1 a physical vapor deposition apparatus 10 capable of performing the method of the invention is shown. This is similar to standard, commercially available equipment as, for example, Planar Magnetron Balzers Model Bas Pm DC/RF Sputtering System (Balzers Alktiemgessellschaft, Liechtenstein). The vacuum chamber 24 has two oppositely positioned gas inlets, a reactive gas inlet 18, and a plasma 28 forming gas inlet 20. Two oppositely positioned entry ports 48A provide access for a partial pressure controller or spectrophotometer 48. Two cathodes 16 (or potentially more) are connected to the lid of the vacuum chamber 24 with different target materials (11, 14) being affixed to the outer surface of each one of the cathodes. Titanium 11 can be the target material on a first one of the cathodes, and pure gold 14 can be the target material on the second one of the two cathodes. The gold targeted 14 cathode 16 is electrically connected to a first power supply 34, and the titanium targeted 11 cathode 16 is electrically connected to a second power supply 36. Both power supplies are also electrically connected (35, 37) to a processor 50. At least one substrate 22 to be coated by the target material is positioned beneath the cathodes 16, being held in place in this case by a planitaric substrate holder 30. The substrate holder 30 in the example has its own power supply 38 electrically connected via insulator 32 at the base of the vacuum chamber to the substrate holder which can serve as the means for monitoring and temperature controlling the substrate 22. The substrate holder 30 has a built-in temperature sensor (not shown) and a heater (not shown) for the purpose of temperature monitoring and control. The substrate holder power supply is also electrically connected 39 to a processor 50. On the left side of FIG. 1 a source of plasma forming gas 40 is shown connected to a flow controller 44 (preferably a mass flow controller), which in turn is connected to metering valve 46 which then connects to the plasma forming gas inlet 20. Again, at the left of FIG. 1 a spectrophotometer 48 is shown connected to spectrometer entry port 48A, the spectrophotometer also being connected 56 to a processor (e.g. a personal computer) 50 which in turn is connected 58 to the metering valve 46. On the right side of FIG. 1 a similar gas inlet and control system is shown, with a source of a reactive gas 42 being connected to a flow controller 44 (preferably a mass flow controller), which in turn is connected to a metering valve 46, which then connects with the reactive gas inlet 18 at the opposite side of the vacuum chamber 24. Again, a spectrophotometer 48 is shown connected to the vacuum chamber 24 via a spectrometer entry port 48A, the spectrophotometer further being connected 52 to a processor 50, which is then connected 54 to the right side metering valve 46.

To use the method of the invention it is first necessary to develop empirically for given target materials and reactive gases the exact conditions for structured film growth. For example, a test run can determine the parameters for discontinuous island dot formations for one target material, as, for example, determining the porosity of a resultant film. Or direct observation of discontinuous island dot formation can be ascertained with transmission or scanning electron micrographs. Similarly the parameters for discontinuous island formation is determined for a second target material, and so on. Detailed readily available information on the physical characteristics of each target material provide data points, which, taken together with test run information, will enable the user to custom fabricate structured, three dimensional anisotropic thin films. While the method of the invention can be utilized under direct operator control, greater convenience and accuracy is obtained utilizing an operator programmed processor.

The method of the deposition of the invention is similar to standard techniques with additional deposition parameter controls as follows:

(1) Prepare the substrate 22. Activate the power supply 38 so as to accurately control the substrate temperature. This is to insure the desired mobility of the sputtered particles adhering to the substrate.

(2) Affix at least two target materials (e.g. 11, 14) to the cathodes 16.

(3) Turn on the vacuum pump (not shown) and evacuate the vacuum chamber 24 via the vacuum port 26.

(4) Introduce a quantity of a plasma forming gas 40 (e.g. argon) into the vacuum chamber via inlet 20, making use of the flow controller 44 and metering valve 46.

(5) Turn on the first gun (power supply #1, 34—FIG. 1). At the same time as the power supply 34 is turned on the spectrophotometer 48 is turned on. It is important to note that simple controlled metering of gases into the vacuum chamber is inadequate. The partial pressure of any gases used must be known and this information processed by a means for controlling the process (e.g. processor 50) so as to further regulate the admitted quantity of gas via the metering valve 46. This is essential so that the precise quantity and particle size of the sputtered target material (11, 14) is created and maintained. The empirical power voltage/partial pressure relationship for each target material as ascertained in trial runs is made a part of the control program within the processor 50.

(7) Accurately control power supply 34, 36 voltage and the time of activation.

(8) Accurate control the temperature of the substrate 22.

(9) Permit a deposition of the first target material 14 for a specific period of time.

(10) If the second target material 11 is to be reacted with a gas the first power supply 34 is turned off and a quantity of a reactive gas 42 is metered into the vacuum chamber 24 using the flow controller 44, metering valve 46, and the inlet 18.

(11). Turn on the second gun (power supply #2, 36—FIG. 1). At the same time turn on the spectrophotometer so that the empirical power voltage/partial pressure relationship of the second target material as programmed into the processor 50 enables the production of an accurate quantity and particle size of this second sputtered target material. In regards to this second target material, the sputtered target material will be deposited on the substrate as a compound of the original target material and reactive gas (e.g. titanium nitride 12).

(12) Permit a deposition of the second reactive target material for a period of time.

(14) Sequentially repeat the precisely timed depositions for each target material until a suitable layer of film (as previously operator determined and incorporated into the program of the processor) has been deposited. The above method can be manually monitored and controlled by an operator. Obviously a control system, such as a processor 50 programmed to perform some or all of the steps of the method will increase accuracy and convenience.

Figure 4:
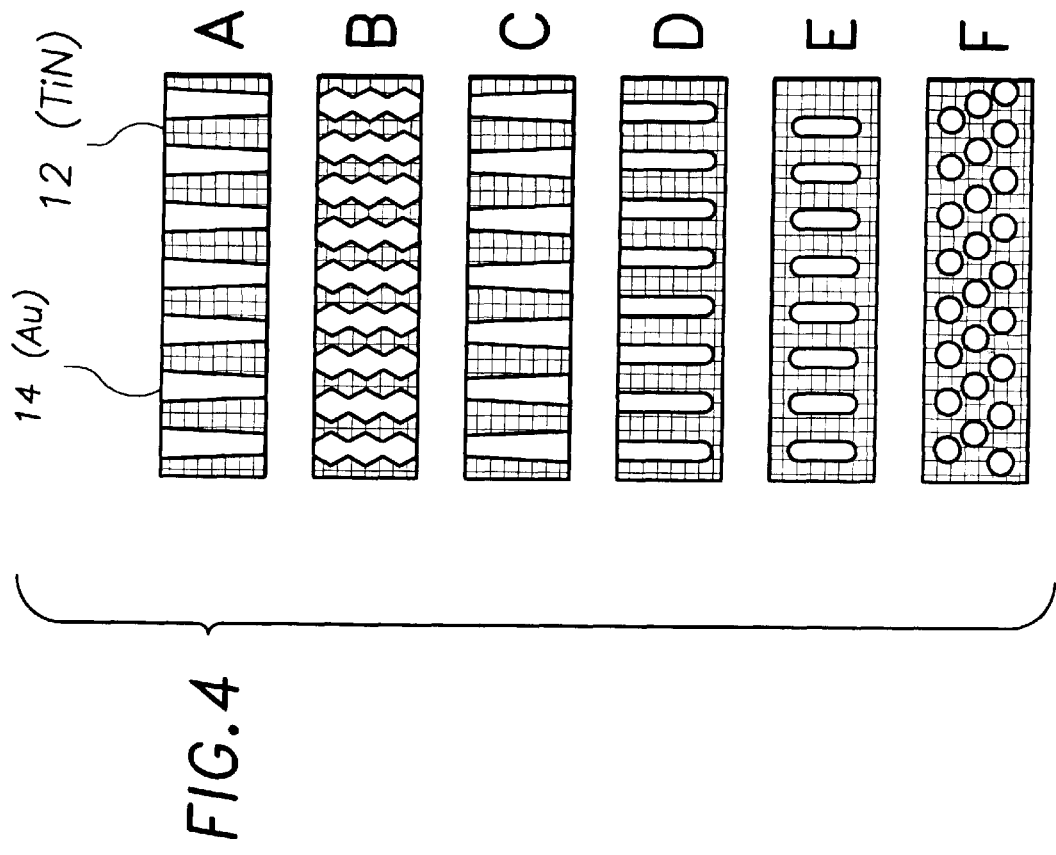
FIG. 4 is a schematic representation of types of three dimensional anisotropic structures created by the method of the present invention.

The differences of the results of this process to standard techniques are best seen in FIGS. 2–4. Standard method parameters inevitably lead to the formation of intermediate layers of material along the X and Y axes, down playing the tendencies of these films to want to expand into the Z axis. As shown in FIG. 2 this results in multi-layered, non-structured, or quantum dot formation. In the method of the invention, shown at the far right in FIG. 2, depositions are controlled into non-continuous individual films. FIG. 4 is a schematic, sectional view of the typical three dimensional anisotropic structures produced. A, B, and C depositions represent different "carrot" type shapes produced. Examples D and E demonstrate that semi-encapsulated and encapsulated structures may be produced. Example F is a top plan view of the structures of A, B, C, and D.

As note above, the method of the invention defines the system into a controllable environment whereby depositions are controlled so as to form non-continuous, individual films. Intermediate layers are not formed.

SPECIFIC EXAMPLE

The following is an example of the method of the invention in which an anisotropic three dimensional film of gold and titanium nitride is produced.

Wearer-Resistant Gold-Like Coating Deposition Particulars (Structure D from FIG. 4):

Substrates were cleaned and prepared per standard deposition

Substrates were loaded into the vacuum chamber, vacuum established and heated with rotation to the deposition temperature (200° C.) and allowed to stabilize for 10 min.

Ar was bleed into the system to the operating pressure (3 mtorr) for Ti magnetron ignition (arcing)

A 40 nm thick Ti deposition was deposited as the adhesion layer, deposition rate=0.2 nm/s.

Nitrogen (5 mtorr) was introduced and deposition of the initial TiN layer was effected: 17 min at a rate of 0.26 nm/s, final thickness equaled 270 nm.
1. Nitrogen was switched off, Au target was switched on and a deposition of 0.6 nm of Au at a rate of 0.03 nm/s (gold "carrots" nucleation stage) was effected;
2. Nitrogen switched on (5 mtorr) and deposition of 11 nm of TiN at a rate of 0.3 nm/s;
3. Nitrogen was switched off, Au target was switched on and a deposition of 1.1 nm of Au at a rate of 0.03 nm/s was effected.
4. Nitrogen switched on (5 mtorr) and deposition of 11 nm of TiN at a rate of 0.3 nm/s;
5. Nitrogen was switched off, Au target was switched on and a deposition of 2.2 nm of Au at a rate of 0.05 nm/s was effected.
6. Nitrogen switched on (5 mtorr) and deposition of 11 nm of TiN at a rate of 0.3 nm/s;
7. Nitrogen was switched off, Au target was switched on and a deposition of 3.4 nm of Au at a rate of 0.08 nm/s was effected
8. Nitrogen switched on (5 mtorr) and deposition of 12 nm of TiN at a rate of 0.23 nm/s;
9. Nitrogen was switched off, Au target was switched on and a deposition of 4.5 nm of Au at a rate of 0.1 nm/s was effected
10. Nitrogen switched on (5 mtorr) and deposition of 13 nm of TiN at a rate of 0.2 nm/s;
11. Nitrogen was switched off, Au target was switched on and a deposition of 5.6 nm of Au at a rate of 0.13 nm/s was effected;
12. Nitrogen switched on (5 mtorr) and deposition of 10 nm of TiN at a rate of 0.2 nm/s;
13. Nitrogen was switched off, Au target was switched on and a deposition of 6.7 nm of Au at a rate of 0.16 nm/s was effected;
14. Nitrogen switched on (5 mtorr) and deposition of 10 nm of TiN at a rate of 0.16 nm/s;
15. Nitrogen was switched off, Au target was switched on and a deposition of 7.9 nm of Au at a rate of 0.19 nm/s was effected;
16. Nitrogen switched on (5 mtorr) and deposition of 7.2 nm of TiN at a rate of 0.16 nm/s;
17. Nitrogen was switched off, Au target was switched on and a deposition of 9.0 nm of Au at a rate of 0.22 nm/s was effected;
18. Nitrogen switched on (5 mtorr) and deposition of 7.0 nm of TiN at a rate of 0.12 nm/s;
19. Nitrogen was switched off, Au target was switched on and a deposition of 9.0 nm of Au at a rate of 0.22 nm/s was effected
20. Nitrogen switched on (5 mtorr) and deposition of 3.0 nm of TiN at a rate of 0.1.

All gases were switched off, the sample was cooled to 120° C. and the samples were removed from the vacuum chamber.

Figure 5:
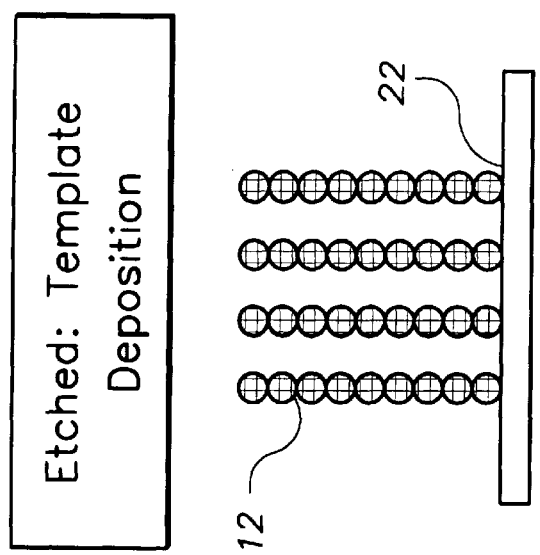
FIG. 5 is an illustration of a three dimensional anisotropic "carrot" like structure created by the method of the present invention, showing one component as having been etched out of the film.
Figure 6:
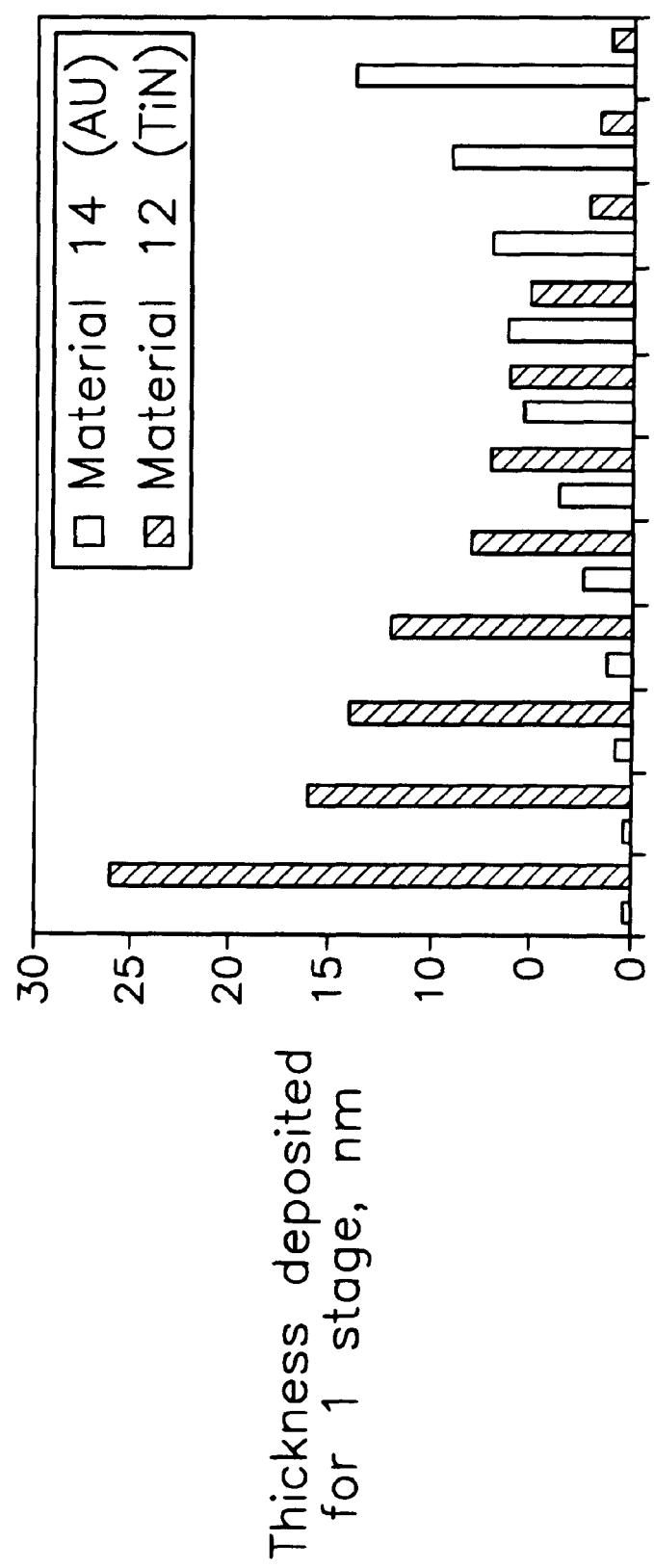
FIG. 6 is a chart illustrating the sequential deposition of gold and titanium nitride onto a substrate in accordance with the method of the invention.

FIG. 6 shows a schematic representation of the steps involved in the formation of the gold-titanium nitride film given above. One method employed to demonstrate the actual "carrot-like" anisotropic three dimensional structure achieved was to etch the resultant film in a mixture of hydrochloric acid and nitric acid (aqua regia) which is known to dissolve gold. A schematic representation of the result of this etching procedure is shown in FIG. 5.

Figure 7A:
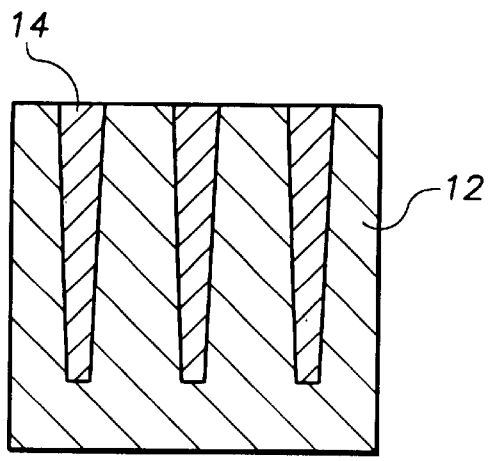
FIG. 7A is a schematic, cross sectional representation of a two component film created by the method of the present invention.
Figure 7B:
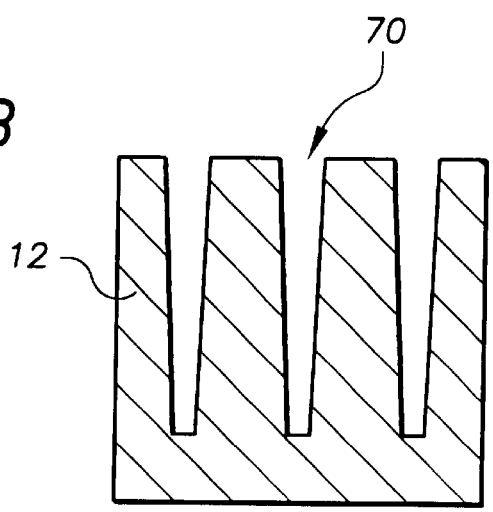
FIG. 7B is a view similar to FIG. 7A showing one of the components as having been removed by etching.
Figure 7C:
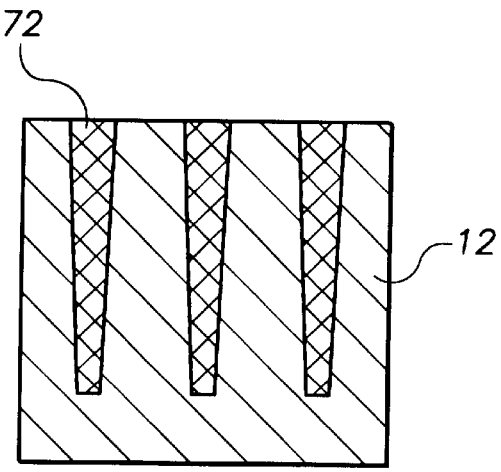
FIG. 7C is a view similar to FIG. 7B showing the empty columns removed by etching in FIG. 7B as now being filled with a new, third component.

As shown in FIGS. 7A, 7B, and 7C the above described etching process provides additional novel applications for these three dimensional anisotropic thin films. FIG. 7A illustrates a possible structure for a two component film of titanium nitride 12 and gold 14. In FIG. 7B the gold component of this film has been completely removed by etching, as, for example, utilizing a mixture of hydrochloric acid and nitric acid. This unique structure now permits a number if interesting applications such as miniature molecular sieves, filters, or templates for nanowires. In FIG. 7C the empty columns 70 shown in FIG. 7B are now shown filled with a material different from the original material of deposition, as, for example, graphite 72. This example of titanium nitride and graphite could be used to facilitate lubrication for a nano-dimensional polishing disc. This introduction of a new component into etched films produced by the method of the invention can be effected in a number of ways, as, for example, field assisted adsorption, capillary action, electrochemical reaction, and mechanical means.

Thus a unique new method for depositing single or multi-component composite systems via vacuum deposition is disclosed. The method allows the formation of preferential growth of discreet formulae within the composite matrix. Results include increased performance and novel applications of the depositions. The method allows for enhanced optical, mechanical, adhesive, compositional, hardness, toughness, wear resistance, reflectance and electrical control and performance. Further, novel structures not heretofore possible can be fabricated.

While the present invention has been disclosed in connection with versions shown and described in detail, various modifications and improvements will become readily apparent to those skilled in the art. Accordingly, the spirit and scope of the present invention is to be limited only by the following claims.

What is claimed is:

1. A method for fabricating a three dimensional anisotropic thin film making use of a PVD process, comprising the steps of:
   (a) preparing a substrate within a vacuum chamber;
   (b) placing at least two target material within said vacuum chamber;
   (c) admitting a quantity of an inert plasma forming gas into said vacuum chamber; and
   (d) vapor depositing said at least two target materials onto a surface of said substrate, a quantity of a first one of said at least two target materials being deposited in a discontinuous island dot formation onto said surface of said substrate, then a quantity of a second one of said at least two target materials being deposited in a discontinuous island dot formation onto said surface of said substrate, and so on, and sequentially repeating said vapor depositions of a quantity of each one of said at least two target materials onto said surface of said substrate until an operator determined amount of each one of said at least two target materials is deposited onto said surface of said substrate, said first one of said at least two target materials preferentially adhering to previously deposited dots of said first target material, said second one of said at least two target materials preferentially adhering to previously deposited dots of said second target material, and so on, said target material depositions forming substantially normal plural columns of each one of said target materials in relation to a beginning area of each one of said columns on said surface of said substrate.

2. The method according to claim 1, further comprising the step of admitting a quantity of a reactive gas into said vacuum chamber during said step of vapor depositing said at least two target materials onto said surface of said substrate, thereby forming a compound of at least one of said at least two target materials with said reactive gas, said compound then being deposited onto said surface of said substrate.

3. The method according to claim 2 wherein a control system integral with said PVD process controls said step of vapor depositing said at least two target materials.

4. The method according to claim 3 wherein said control system accurately controls both quantity and time of voltage supply to said target materials.

5. The method according to claim 4 wherein said control system further provides accurate control of the partial pressure of said plasma forming gas and/or said reactive gas, and spectral control of said plasma forming gas and/or said reactive gas.

6. The method according to claim 5 further providing accurate substrate temperature control.

7. The method according to claim 6 wherein said control system is a program incorporated within at least one processor, said processor further activating said control system in accordance with the dictates of said program.

8. The method according to claim 2 wherein said first one of said at least two target materials is gold, and said second one of said at least two target materials is titanium.

9. The method according to claim 8 wherein said titanium is reacted with nitrogen, said nitrogen acting as said reactive gas during said step of vapor depositing said at least two target materials, thereby depositing said titanium as titanium nitride onto said surface of said substrate.

10. A method for fabricating a three dimensional anisotropic thin film making use of a PVD process, comprising the steps of:
    (a) selecting at least two target materials with operator previously determined vacuum sputtering characteristics, said vacuum sputtering characteristics including discontinuous island dot formation onto a surface of a substrate;
    (b) preparing said substrate, and placing said substrate within a vacuum chamber;
    (c) placing said at least two target materials within said vacuum chamber;
    (d) admitting a quantity of an inert plasma forming gas into said vacuum chamber; and
    (e) sequentially controlling a vapor deposition of said target materials onto a surface of said substrate, a quantity of a first one of said target materials being deposited in said discontinuous island dot formation onto said surface of said substrate, then a quantity of a second one of said target materials being deposited in said discontinuous island dot formation onto said surface of said substrate, and so on, and sequentially repeating said depositions of each one of said target materials onto said surface of said substrate until an operator determined amount of each one of said target materials has been deposited onto said surface of said substrate, said first one of said target materials preferentially adhering only to previously deposited dots of said first target material, said second one of said target materials preferentially adhering only to previously deposited dots of said second target material, and so on, said target material depositions forming substantially normal plural columns of each one of said target materials in relation to a beginning area of each one of said columns on said surface of said substrate.

11. The method according to claim 10 wherein said step of sequentially controlling said vapor depositions of said target materials includes real-time accurate monitoring and feed-back adjusting of:
    (a) quantity and time of voltage supply to said target materials;
    (b) partial pressure of said plasma;
    (c) spectral control of said plasma; and
    (d) temperature control of said substrate.

12. The method according to claim 10, further comprising the step of admitting a quantity of a reactive gas into said vacuum chamber during said step of sequentially controlling said vapor depositions, thereby forming a compound of at least one of said at least two target materials with said reactive gas, said compound then being deposited onto said surface of said substrate.

13. The method according to claim 12 wherein said step of sequentially controlling said vapor depositions of said target materials includes real-time accurate monitoring and feed-back adjusting of:
    (a) quantity and time of voltage supply to said target materials;
    (b) partial pressure of said plasma and said reactive gas;
    (c) spectral control of said plasma and said reactive gas; and
    (d) temperature control of said substrate.

14. The method according to claim 12 wherein said first target material of said at least two target materials is gold, and said second target material of said at least two target materials is titanium.

15. The method according to claim 13 wherein said first target material of said at least two target materials is, gold, and said second target material of said at least two target materials is titanium.

16. The method according to claim 14 wherein said titanium is reacted with nitrogen, said nitrogen acting as said reactive gas during said step of sequentially controlling said vapor depositions, thereby depositing said titanium as titanium nitride onto said surface of said substrate.

17. The method according to claim 15 wherein said titanium is reacted with nitrogen, said nitrogen acting as said reactive gas during said step of sequentially controlling said vapor depositions, thereby depositing said titanium as titanium nitride onto said surface of said substrate.

18. The method according to claim 10 further comprising the step of etching said surface of said substrate, after the deposition thereon of said at least two target materials, thereby removing at least one of said target materials from said surface of said substrate.

19. The method according to claim 18 further comprising the step of depositing at least one substance different from said target materials, after said step of etching said surface of said substrate, within empty columns formed by said step of etching said surface of said substrate.

* * * * *